US005530274A

United States Patent [19]
Fujioka

[11] Patent Number: 5,530,274
[45] Date of Patent: Jun. 25, 1996

[54] MOS CAPACITOR, VPP SWITCH CIRCUIT, CHARGE PUMP CIRCUIT, EEPROM, MICROCOMPUTER, AND IC CARD

[75] Inventor: Shuzo Fujioka, Itami, Japan

[73] Assignee: Mitsubishi Denki Kabushiki Kaisha, Tokyo, Japan

[21] Appl. No.: 407,716

[22] Filed: Mar. 21, 1995

[30] Foreign Application Priority Data

Mar. 25, 1994 [JP] Japan .................................. 6-055671

[51] Int. Cl.⁶ .................. H01L 27/108; H01L 29/76; H01L 31/119; H01L 29/94
[52] U.S. Cl. ................ 257/300; 257/306; 257/307
[58] Field of Search .................................. 257/299, 300, 257/532, 308, 307, 306

[56] References Cited

U.S. PATENT DOCUMENTS

| | | | |
|---|---|---|---|
| 3,704,384 | 11/1972 | DeSimone et al. | 257/300 |
| 4,223,333 | 9/1980 | Masuoka | 257/299 |
| 4,768,828 | 11/1988 | Hoffman | 257/532 |
| 5,282,159 | 1/1994 | Ueda et al. | 257/307 |

FOREIGN PATENT DOCUMENTS

| | | |
|---|---|---|
| 56-58253 | 5/1981 | Japan . |
| 59-104561 | 6/1984 | Japan . |

OTHER PUBLICATIONS

Nikkei Electronics, 1986, pp. 133–144.

*Primary Examiner*—Stephen D. Meier
*Attorney, Agent, or Firm*—Leydig, Voit & Mayer

[57] ABSTRACT

An MOS capacitor includes a semiconductor substrate having at its surface at least one field-forming section; an insulating film on the surface of the semiconductor substrate covering the field-forming section and having at least an opening within the field-forming section; a conducting layer on the insulating film and having an opening formed at the opening in the insulating film; a first electrode layer electrically connected to the conducting layer; and a second electrode layer passing through the opening in the conducting layer and the opening in the insulating film and electrically connected to the surface of the semiconductor substrate. Since the second electrode layer passes through the opening in the conducting layer and the opening in the insulating film and is electrically connected to the surface of the semiconductor substrate at an inner portion of the field-forming section, resistance is decreased and frequency characteristics are improved.

11 Claims, 7 Drawing Sheets

MOS CAPACITOR, VPP SWITCH CIRCUIT, CHARGE PUMP CIRCUIT, EEPROM, MICROCOMPUTER, AND IC CARD

BACKGROUND OF THE INVENTION

1. Field of the Invention

The invention relates to an MOS capacitor with improved frequency characteristics. The invention also relates to a Vpp switch circuit and charge pump circuit employing such an MOS capacitor, and an EEPROM, a microcomupter and an IC card.

2. Description of the Related Art

FIGS. 14 and 15 each illustrate a conventional MOS capacitor. In this capacitor, gate oxide film 8 is disposed between a polysilicon film 2 and a P substrate 7 for forming polysilicon film 2 spaced from P substrate 7. An oxide film 9 is disposed on the polysilicon film 2. Aluminum electrode layers 3 and 5 are disposed on oxide film 9. A portion of aluminum electrode layer 3 passes through oxide film 9 and contacts polysilicon film 2 to form aluminum contact 6. On the other hand, a portion of aluminum electrode layer 5 passes through oxide film 9 and contacts N diffusion region 10 in the P substrate 7 to form a field contact 4. This field contact 4 is disposed along a side 1a (see FIG. 16) of a rectangular field 1, region of P substrate 7 spaced from a field oxide film 11.

Application of a voltage between aluminum electrode layers 3 and 5 having a value greater than the threshold voltage value Vth required for channel formation forms an N inversion layer 12, acting as a channel, progressively from the portion adjacent to N diffusion layer 10 to within field 1. Charges accumulate at the portion where field 1 is opposite the polysilicon film 2 with the gate oxide film 8 therebetween. This portion functions as a capacitor. That is, as shown in the equivalent circuit of FIG. 16, a plurality of small capacitors are connected by resistors therebetween toward a side 1b opposite side 1a of field 1. Applying a voltage V causes voltage to be applied starting from the small capacitor adjacent to side 1a of field 1 and progressing successively to the other capacitors toward side 1b. This means that more time is required for the charging and discharging of the small capacitors closer to side 1b opposite side 1a than those closer to side 1a of field 1. For this reason, when voltage changes occur at high frequencies, the capacitors are incapable of functioning as desired.

In manufacturing an MOS capacitor, subjecting the surface of P substrate 7 where the channel is formed to capacitor doping allows the threshold voltage value Vth required for channel formation to be reduced. Reducing the threshold voltage value Vth in this way reduces the charging and discharging time required for even the small capacitors closer to the side 1b of field 1 opposite side 1a. Therefore, an MOS capacitor capable of operating at high frequencies can be formed.

Using such an MOS capacitor having a low threshold voltage value Vth in a Vpp switch circuit used, for example, to select either "supply voltage Vpp for writing into EEPROM" or "not supply voltage Vpp for writing into EEPROM", causes more leakage current to flow, which often results in malfunctioning of the capacitor. Even when a charge pump circuit which develops a voltage Vpp for writing into an EEPROM or the aforementioned Vpp switch circuit is not operating, the current consumption becomes large due to a large load capacitance because of the capacitor built into the circuit.

As described above, conventional MOS capacitors have the problem of poorer operation at higher frequencies. Another problem is that decreasing the threshold voltage value Vth to allow the capacitor to operate at high frequencies often results in malfunctioning when used in a Vpp switch circuit. A further problem is that Vpp switch circuits and charge pump circuits using conventional capacitors have a higher current consumption due to higher load capacity.

SUMMARY OF THE INVENTION

In view of the above-described problems, the invention aims at providing a highly reliable MOS capacitor capable of operating even at high frequencies.

The invention also aims at providing a Vpp switch circuit and charge pump circuit employing such an MOS capacitor.

The invention further aims at providing an EEPROM, a microcomputer, and an IC card employing such a Vpp switch circuit or charge pump circuit.

According to a first aspect of the invention, there is provided a MOS capacitor comprising a semiconductor substrate having on its surface at least one field forming section; an insulation film, on the surface of the semiconductor substrate covering the field, having at least an opening at a position corresponding to the inner portion of the field; a conducting layer on the insulation film and having an opening at a position corresponding to the position of the opening in the insulating film; a first electrode layer electrically connected to the conducting layer; and a second electrode layer passing through the opening of the conducting layer and the opening of the insulating layer and electrically connected to the surface of the semiconductor substrate.

According to a second aspect of the invention, there is provided a Vpp switch circuit comprising a MOS capacitor having at least one field contact in the inner portion of the field; a selection signal line used for selecting either "supply write voltage Vpp" or "not supply write voltage Vpp"; and a transistor connected to the MOS capacitor and turned on and off in accordance with the signal level of selection signal line.

According to a third aspect of the invention, there is provided a charge pump circuit comprising a plurality of capacitors each having at least one field contact in the inner portion of the field; and a plurality of transistors each connected to a corresponding MOS capacitor in a series arrangement.

According to a fourth aspect of the invention, there is provided an EEPROM comprising a charge pump circuit having a plurality of first MOS capacitors each having at least one field contact in the inner portion of the field and generating a voltage Vpp for writing to an EEPROM, a memory cell array having a plurality of memory cells; and a plurality of Vpp switch circuits each having a second MOS capacitor having at least one field contact in the inner portion of the field and selectively supply a write voltage Vpp generated by the charge pump circuit to the respective memory cells of the memory cell array.

According to a fifth aspect of the invention, there is provided a microcomputer comprising a CPU for data processing; and an EEPROM having a charge pump circuit with a plurality of MOS capacitors each having at least one field contact in the inner portion of the field, a memory array having a plurality of memory cells, and a plurality of Vpp switch circuits having MOS capacitors each having at least one field contact in the inner portion of the field.

According to a sixth aspect of the invention, there is provided an IC card comprising a CPU for data processing; and an EEPROM having a charge pump circuit with a plurality of MOS capacitors each having at least one field contact in the inner portion of the field, a memory cell array having a plurality of memory cells, and a plurality of Vpp switch circuits having MOS capacitors each having at least one field contact in the inner portion of the field.

DESCRIPTION OF THE PREFERRED EMBODIMENTS

A description will be made below of the embodiments of the invention with reference to the attached drawings.

First Embodiment

Figure 1:
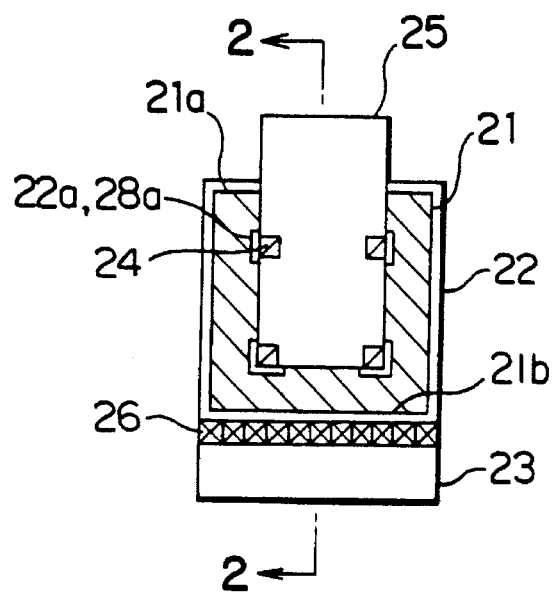
FIG. 1 is a plan view of an MOS capacitor of a first embodiment of the invention.
Figure 2:
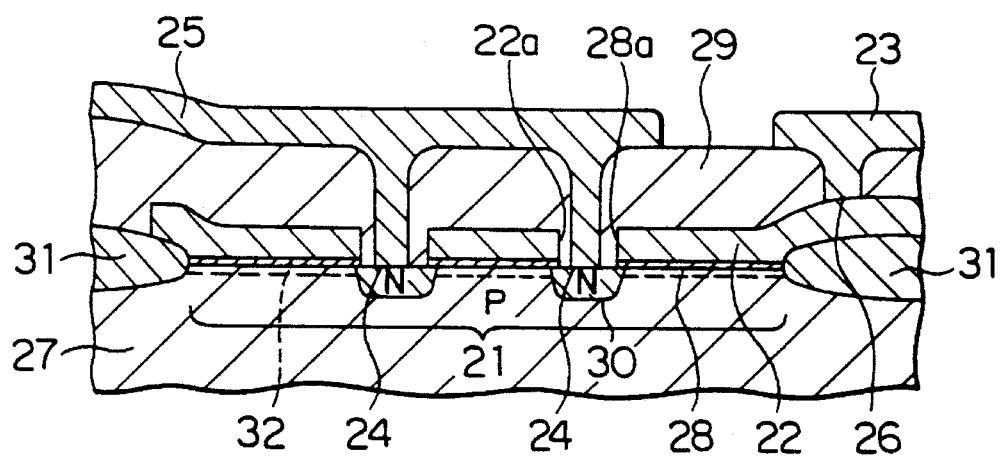
FIG. 2 is a cross sectional view taken along line 2—2 of FIG. 1.

FIGS. 1 and 2 each illustrate a MOS capacitor of a first embodiment of the invention. Referring to these figures, a rectangular field 21 occupies a section on the surface of a P substrate 27 bounded by a field oxide film 31. A polysilicon film 22 is disposed opposite the field 21 and separated from it by a gate oxide film 28. An oxide film 29 is disposed on the polysilicon film 22. Aluminum electrode layers 23 and 25 are disposed on the oxide film 29. A portion of the aluminum electrode layer 23 passes through oxide film 29, and contacts the polysilicon film 22 to form an aluminum contact 26. Four openings 28a are formed in the gate oxide film 28, and four openings 22a are also formed in the polysilicon film 22 at corresponding positions. These openings 28a and 22a are uniformly spaced across the field 21. Portions of aluminum electrode layer 25 pass through the oxide film 29 and pass through the openings 22a of the polysilicon film 22 and the openings 28a of the gate oxide film 28, and come into contact with N diffusion regions 30 in the surface of the P substrate 27 to form field contacts 24. That is, as shown in FIG. 1, four field contacts 24 are uniformly spaced across field 21, with the field contacts 24 connected to the aluminum electrode layer 25.

P substrate 27 forms the semiconductor substrate; gate oxide film 28 forms the insulation layer; polysilicon film 22 forms the conducting layer; and aluminum electrode layers 23 and 25 form, respectively, the first and second electrode layers.

Figure 3:
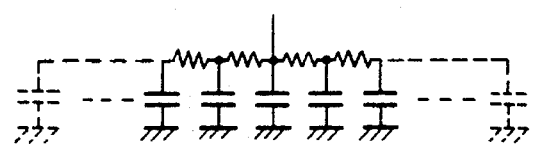
FIG. 3 is an equivalent circuit diagram of the capacitor of the first embodiment.
Figure 4:
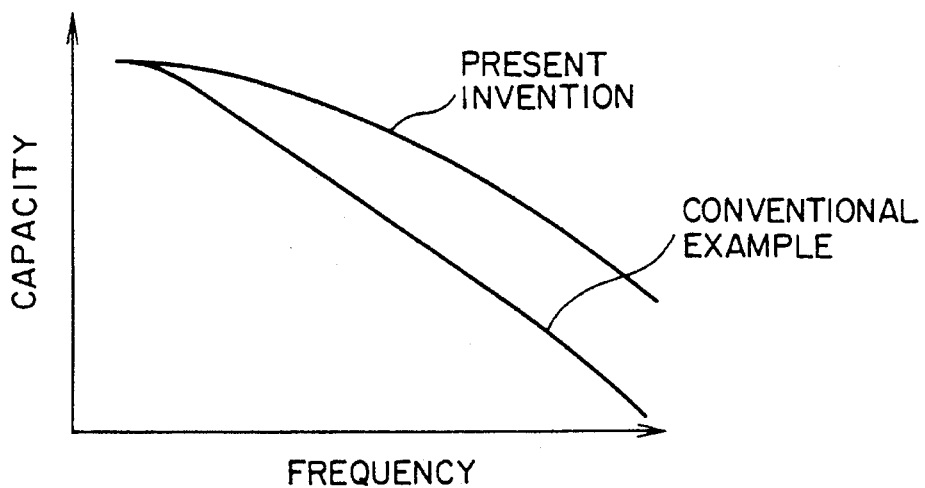
FIG. 4 is a graph showing a frequency characteristic of the capacitor of the first embodiment.
Figure 14:
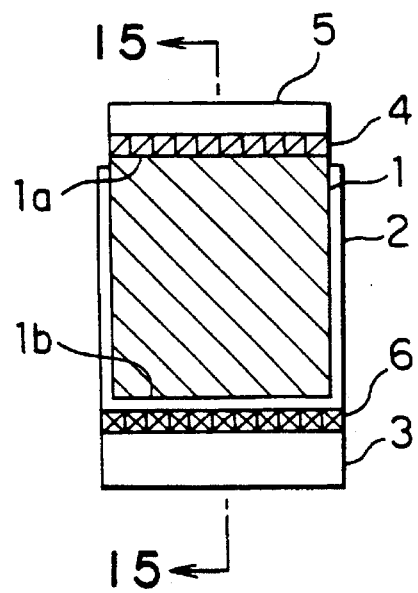
FIG. 14 is a plan view of a conventional MOS capacitor.
Figure 15:
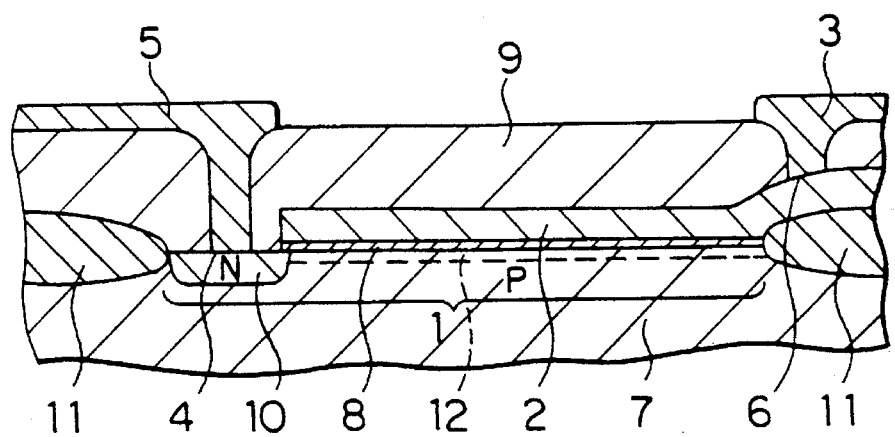
FIG. 15 is a cross sectional view taken along line 15—15 of FIG. 14.
Figure 16:
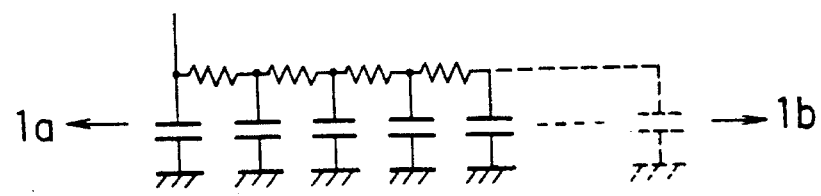
FIG. 16 is an equivalent circuit diagram of the capacitor of FIG. 14.

Applying a voltage V greater than threshold voltage value Vth required for channel formation between aluminum electrode layers 23 and 25 causes formation of an N inversion layer 32 acting as channel within field 21. Charges accumulate on the portion where the field 21 and polysilicon film 22 are superimposed upon each other by gate oxide film 28. This portion functions as a capacitor. In the MOS capacitor of the first embodiment, field contacts 24 are disposed in the field 21, so that the equivalent circuit becomes like that shown in FIG. 3 in which electrodes are drawn out from the central portions of a plurality of small capacitors. This reduces the resistance. Comparison of the conventional capacitor of FIGS. 14 and 15 with the capacitor of the invention showed that the frequency characteristic is improved, as shown in FIG. 4. In the conventional capacitor, a higher frequency greatly reduces capacitance, while in the capacitor of the first embodiment, this reduction in capacitance is less. In other words, the capacitor of the invention is capable of functioning normally at higher frequencies.

In the above-described first embodiment, while a P substrate was used as the semiconductor substrate, an N substrate may also be used to construct a capacitor of the same construction.

Second Embodiment

Figure 5:
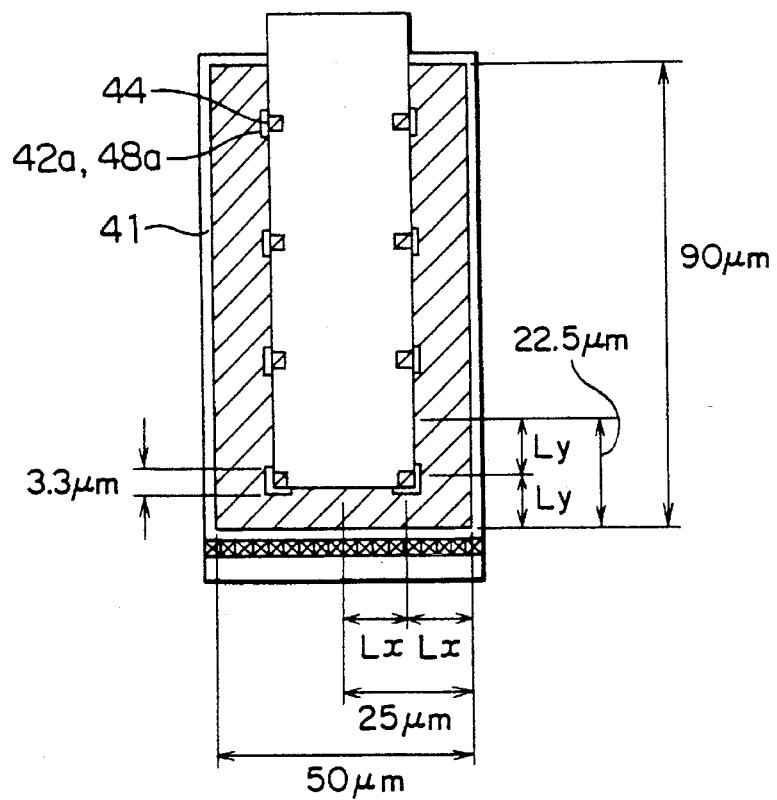
FIGS. 5, 6, and 7 are each plan views illustrating MOS capacitors respectively of second through fourth embodiments.

FIG. 5 illustrates an MOS capacitor having eight field contacts 44 disposed in a rectangular field 41 as in the first embodiment. A capacitor of she second embodiment is compared with the conventional capacitor. With field 41 measuring 50×90 μm in size, eight openings 42a and 48a in a polysilicon film and gate oxide film each 3.3×3.3 μm in size, and gate sheet capacitance of $0.83 \times 10^{-16}$ F/μm$^2$, the capacitor of the second embodiment has a static capacity C1={(50×90)−(3.3×3.3×8)}×0.83×10$^{-15}$=3.66 pF. On the other hand, the conventional capacitor having the construction of FIG. 14 of the same size has a static capacity C2=50×90×0.83×10$^{-15}$ =3.75 pF. Since the capacitor of the second embodiment has eight field contacts 44 disposed in field 41, the static capacity is slightly decreased by that proportion.

In calculating conductance β from the voltage distribution, since in the capacitor of the second embodiment, L=(Lx+Ly)/2=11.2 μm, W={22.5×25)/L}×8=401 μm, β1=(W/L)×k=35.8 k, where k is a constant. On the other hand, in the conventionally constructed capacitor, L=90×2= 180 μm, and W=50/2=25 μm, so that the conductance β2=0.14k. Since the resistance value is calculated as the reciprocal of conductance, the resistance of the capacitor of the second embodiment is approximately 1/250th of the conventional capacitor having a field of the same size.

The portions of the field 41 where the field contacts 44 are disposed produce unnecessary load capacitance. Since eight field contacts 44 are disposed in the second embodiment, unnecessary load capacitance corresponding to an area S1=3.3×3.3×8=87.1 μm$^2$ is produced. On the other hand, in the conventionally constructed capacitor, since the field contacts are formed in a linear manner along a portion of the rectangular field, in forming 3.3 μm wide field contacts along a shorter side of the field having the same size, 50×90 μm, as in the second embodiment, unnecessary load capacitance corresponding to an area S2=3.3×50=165 μm² is produced. This means that in the capacitor of the second embodiment, unnecessary load capacitance is approximately halved.

In the conventionally constructed capacitor, the resistance can be decreased by capacitor doping. However, in this case, the entire field has a constant capacitance, which results in the production of more unnecessary load capacitance.

Third Embodiment

Figure 6:
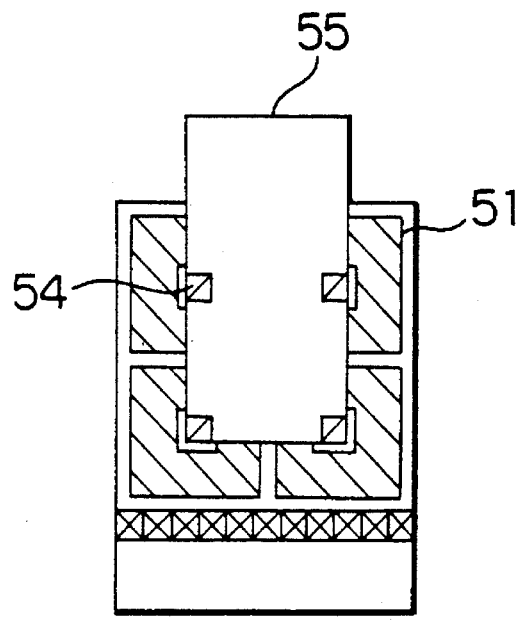

FIG. 6 illustrates an MOS capacitor of a third embodiment. In this capacitor, the field is divided into four field sections 51, each of which has field contact 54 formed at its central portion. These four field contacts 54 are connected to one aluminum electrode layer 55. The capacitor has similar characteristics to those of the first embodiment. Since the field is divided, however, it is easier to simulate such characteristics as, for example, capacitance or resistance.

Fourth Embodiment

Figure 7:
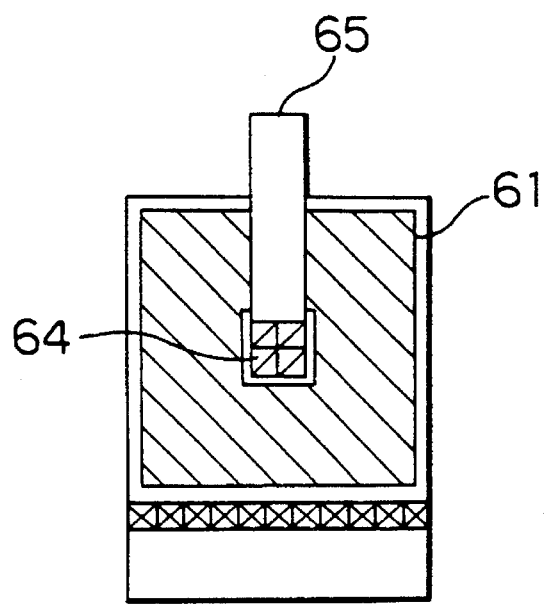

FIG. 7 illustrates an MOS capacitor of a fourth embodiment. In this capacitor, one field contact 64 is formed in the central portion of field 61, and is connected to aluminum electrode layer 65. Such a simplified structure in which the field contact is formed only at the central portion of the field, in the same way, results in reduced resistance and unnecessary load capacitance, and improved frequency characteristics.

Fifth Embodiment

Figure 8:
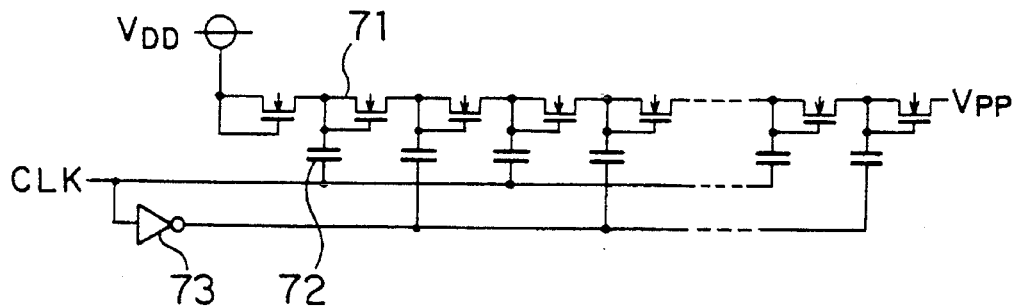
FIG. 8 is a circuit diagram of a charge pump circuit of a fifth embodiment.
Figure 9:
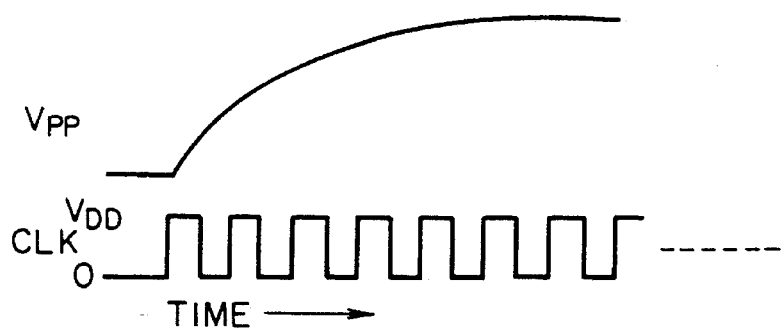
FIG. 9 is a timing chart illustrating the operation of the circuit of the fifth embodiment.

FIG. 8 illustrates a charge pump circuit using the MOS capacitor of the invention. A plurality of transistors 71 are connected in series, each of which has connected thereto an MOS capacitor 72 of the invention. Clock signal CLK and inverted clock signal $\overline{CLK}$ produced by inverter circuit 73 are supplied to every other capacitor 72. With this construction, voltage $V_{DD}$ at one end of the series arrangement applied to capacitors 71 is increased in value to voltage Vpp and output from transistor 71 at the other end of the series arrangement. The relationship between clock signal CLK and output voltage Vpp in the charge pump circuit is illustrated in the timing chart of FIG. 9.

The drive capacitance of the charge pump circuit is virtually determined by clock signal CLK frequency and capacitance of the capacitor used. In this embodiment, capacitors 72 capable of operating at higher frequencies than the conventional capacitor are used, so that a charge pump circuit formed with the same pattern area as the conventional capacitor will have better drive capacity. In addition, in capacitors 72 of the invention, it is possible to decrease load capacitance, so that Vcc and Icc margins can be improved.

Sixth Embodiment

Figure 10:
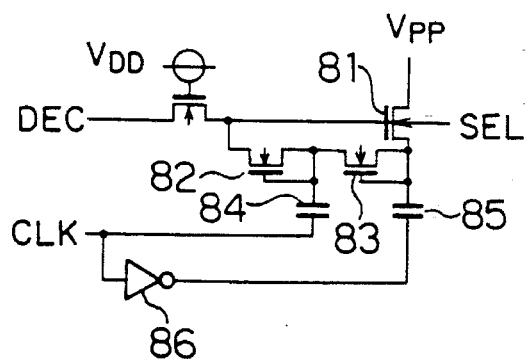
FIG. 10 is a circuit diagram of a Vpp switch circuit of a sixth embodiment.

FIG. 10 illustrates a Vpp switch circuit employing the MOS capacitor of the invention. Transistors 82 and 83 are connected in series between the gate and source of transistor 81, each of which has connected thereto respectively, MOS capacitors 84 and 85 of the invention. Clock signals CLK and inverted clock signal $\overline{CLK}$ produced by inverter circuit 86 are applied to the capacitors 84 and 85. A selection signal line SEL is connected to the gate of transistor 81 for selecting either "supply write voltage vpp" or "not supply write voltage Vpp". When the selection signal line SEL has a high signal level, voltage Vpp supplied to the drain of transistor 81 is applied to the selection signal line SEL. On the other hand, when it has a low signal level, voltage Vpp will not be applied thereto.

The drive capacitance of Vpp switch circuit is virtually determined by the frequency of clock signal CLK and the capacitance of the capacitor used. Since, in this embodiment, capacitors 84 and 85 capable of operating at higher frequencies than the conventional capacitor are used, a Vpp switch circuit formed with the same pattern area as the conventional one will have better drive capacitance. In capacitors 84 and 85 of the invention, it is possible to decrease load capacitance, so that Vcc and Icc margins can be improved.

Seventh Embodiment

Prevention of malfunctioning and improvement in Icc can be achieved by setting a greater threshold value for the capacitor used in the Vpp switch circuit of the sixth embodiment, that is, voltage level Vth required to form the inversion layer, than the threshold values of the other transistors in the Vpp switch circuit. Although voltage Vpp will not be applied to capacitors 84 and 85 when the selection signal line SEL of the Vpp switch circuit has a low signal level, when the threshold values Vth of these capacitors are set lower than the threshold values of transistors 82 and 83, the selection signal line SEL level may be charged up by leakage current and thereby inverted. To prevent erroneous inversion of the selection signal line, in this embodiment the threshold values vth of capacitors 84 and 85 are set higher than the threshold values of the transistors 82 and 83.

Eighth Embodiment

Figure 11:
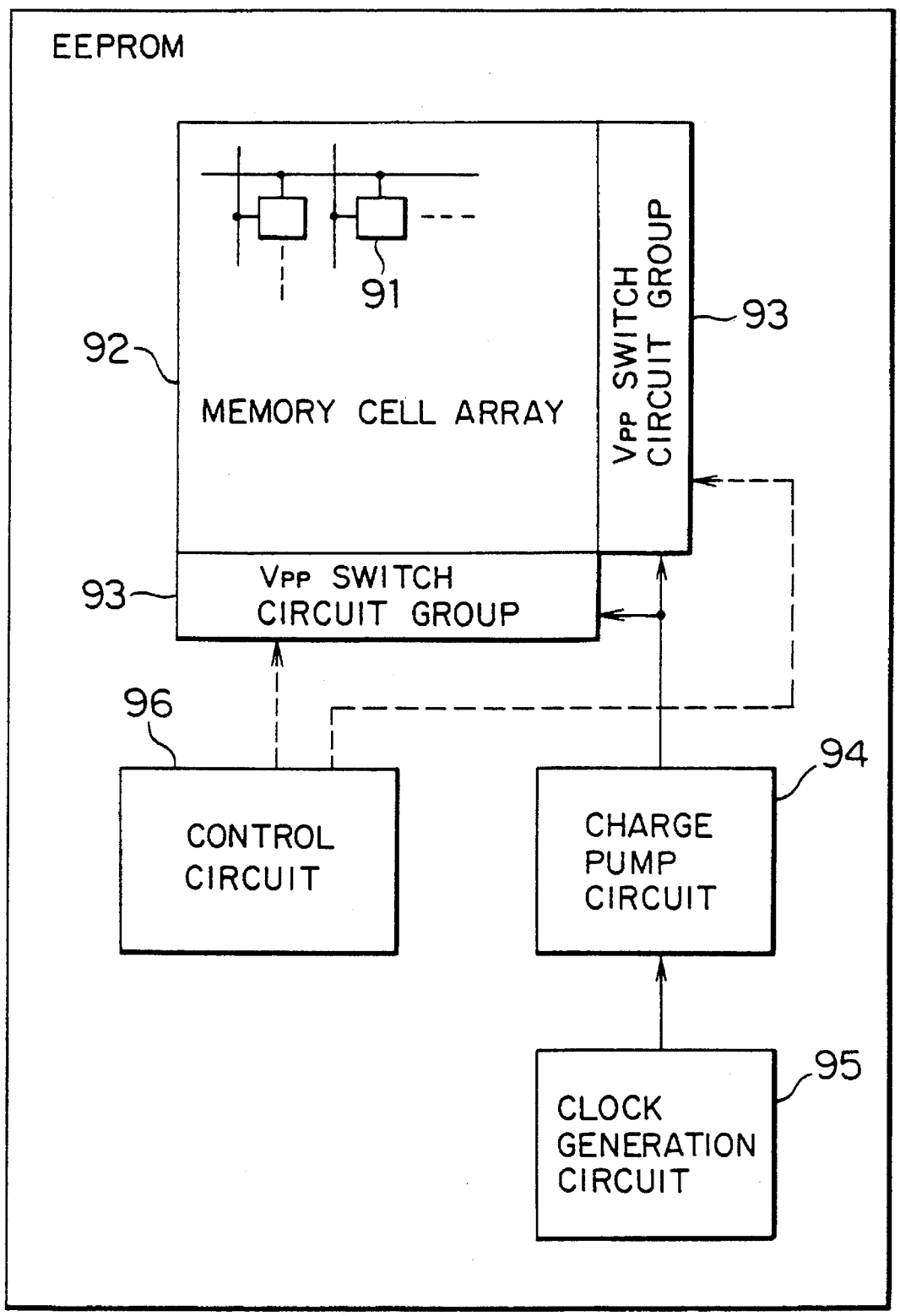
FIG. 11 is a block diagram of an EEPROM of an eighth embodiment.

FIG. 11 illustrates an EEPROM of the eighth embodiment. The charge pump circuit in the fifth embodiment and the Vpp switch circuit of embodiments 6 or 7 are used in the EEPROM. Vpp switch circuit groups 93 are connected to memory cell array 92 having a plurality of memory cells 91. The Vpp switch circuit groups 93 include a plurality of Vpp switch circuits of either embodiment 6 or 7 provided in correspondence with each memory cell array 92 bit line and word line. That is, as shown in FIG. 10, each Vpp switch circuit includes second MOS capacitors 84 and 85 each having at least one field contact in the field; selection signal line SEL for selecting either "supply write voltage Vpp" or "not supply write voltage Vpp"; and second transistors 81 through 83 connected to second MOS capacitors 84 and 85 and turned on and off in accordance with the selection signal line level.

The charge pump circuit 94 of the fifth embodiment is connected to this Vpp switch circuit groups 93. That is, as shown in FIG. 8, the charge pump circuit 94 includes a plurality of first MOS capacitors 72 each of which has at least one field contact in the inner portion of the field; and a plurality of first transistors 71 each of which are connected to a corresponding MOS capacitor 72 in series. A clock generating circuit 95 is connected to the charge pump circuit 94, and a control circuit 96 is connected to the Vpp switch circuit groups 93. Since a plurality of Vpp switch circuits and charge pump circuits employing MOS capacitors of the invention are used, highly reliable operation at high frequencies and improvement in Icc and Vcc margins can be achieved.

Ninth Embodiment

Figure 12:
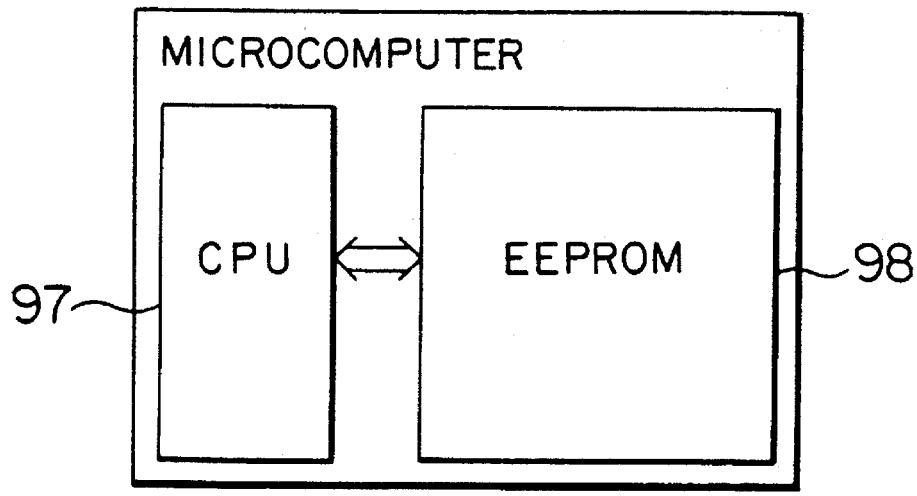
FIG. 12 illustrates a microcomputer of a ninth embodiment.

FIG. 12 illustrates an EEPROM built-in microcomputer in the ninth embodiment. This microcomputer has a CPU 97 for signal processing, and the EEPROM 98 of the eighth embodiment. Therefore, highly reliable, operation at higher frequencies and improvements in Icc and Vcc margins can be achieved.

Tenth Embodiment

Figure 13:
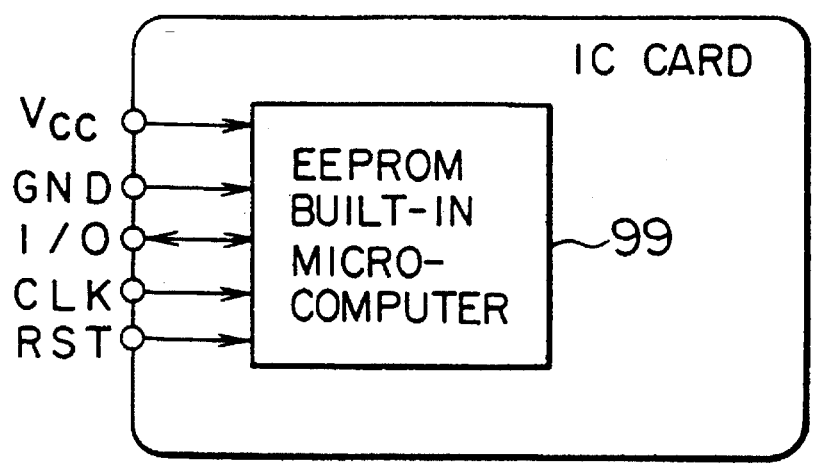
FIG. 13 illustrates an IC card of a tenth embodiment.

FIG. 13 illustrates an IC card of the tenth embodiment. EEPROM built-in microcomputer 99 of the ninth embodiment is mounted on the IC card. The incorporation of microcomputer 99 results in improved Icc and Vcc margins, which allows IC operation, for example, using one battery having a voltage of three volts. In addition, this results in enhanced reliability in the operation of the IC card.

What is claimed is:

1. An MOS capacitor comprising:
   a semiconductor substrate including a surface:
   a field oxide disposed on the surface defining and forming a periphery of at least one field-forming area of the surface;
   an electrically insulating film disposed on the surface of said semiconductor substrate covering part of the field-forming area and having at least one opening at a position entirely within the field-forming area spaced from field oxide;
   an electrically conducting layer disposed on said insulating film and having an opening corresponding to the opening in said insulating film;
   a first electrode layer electrically connected to said conducting layer; and
   a second electrode layer extending through the opening in said conducting layer and the opening in said insulating film and electrically connected to the surface of the semiconductor substrate.

2. The MOS capacitor according to claim 1 wherein said insulating film has a plurality of openings entirely within the field-forming area, each of the openings being spaced from the field oxide, said conducting layer has a plurality of openings at positions respectively corresponding to positions of the openings in said insulating film, and said second electrode layer passes through each of the openings in said conducting layer and in said insulating film and is electrically connected to the surface of said semiconductor substrate at a plurality of locations spaced from the field oxide.

3. The MOS capacitor according to claim 2 wherein said semiconductor substrate has a single field-forming area and said insulating film has a plurality of openings at positions entirely within the field-forming area and spaced from the field oxide.

4. The MOS capacitor according to claim 2 wherein said semiconductor substrate has a plurality of field-forming areas and said insulating film has at least one opening within each of the field-forming areas and spaced from the field oxide.

5. The MOS capacitor according to claim 1 wherein said semiconductor substrate has a single field-forming area and said insulating film has a single opening centrally located within the field-forming area and spaced from the field oxide.

6. A Vpp switch circuit comprising:
   a semiconductor substrate including a surface;
   a field oxide disposed on the surface defining and forming a periphery of at least one field-forming area of the surface;
   an electrically insulating film disposed on the surface of said semiconductor substrate covering part of the field-forming area and having at least one opening at a position entirely within the field-forming area spaced from the field oxide;
   an electrically conducting layer disposed on said insulating film and having an opening corresponding to the opening in said insulating film;
   a first electrode layer electrically connected to said conducting layer;
   a second electrode layer extending through the opening in said conducting layer and the opening in said insulating film and electrically connected to the surface of the semiconductor substrate;
   a selection signal line for supplying high and low "supply write voltage Vpp" and "not supply write voltage Vpp" signal levels; and
   a transistor connected to said MOS capacitor and said selection signal line and turned on and off in accordance with the signal level on said selection signal line.

7. The Vpp switch circuit according to claim 6 wherein said MOS capacitor has a threshold voltage greater than a threshold voltage of said transistor.

8. A charge pump circuit comprising:
   a semiconductor substrate including a surface and a field oxide disposed onpart of the surface;
   a plurality of MOS capacitors, each MOS capacitor including:
   a field-forming area on the surface of said semiconductor substrate defined at a periphery by the field oxide;
   an electrically insulating film disposed on the surface of said semiconductor substrate covering part of the field-forming section and having at least one opening at a position entirely within the field-forming area, spaced from the field oxide;
   an electrically conducting layer disposed on said insulating film and having an opening corresponding to the opening in said insulating film;
   a first electrode layer electrically connected to said conducting layer;
   a second electrode layer extending through the opening in said conducting layer and the opening in said insulating film and electrically connected to the surface of the semiconductor substrate; and
   a plurality of transistors, each transistor being connected to a corresponding MOS capacitor in a series arrangement.

9. An EEPROM comprising:
   a semiconductor substrate including a surface and a field oxide disposed on part of the surface;
   a charge pump circuit having a plurality of first MOS capacitors for generating a voltage Vpp for writing data into an EEPROM and each first MOS capacitor having:
   a field-forming area on the surface of said semiconductor substrate defined at a periphery by the field oxide;
   an electrically insulating film disposed on the surface of said semiconductor substrate covering part of the field-forming section and having at least one opening at a position entirely within the field-forming area, spaced from the field oxide;

an electrically conducting layer disposed on said insulating film and having an opening corresponding to the opening in said insulating film;

a first electrode layer electrically connected to said conducting layer; and a second electrode layer extending through the opening in said conducting layer and the opening in said insulating film and electrically connected to the surface of the semiconductor substrate;

a memory cell array having a plurality of memory cells; and a plurality of Vpp switch circuits, each Vpp switch circuit having a second MOS capacitor, each second MOS capacitor having:

a field-forming area on the surface of said semiconductor substrate defined at a periphery by the field oxide;

an electrically insulating film disposed on the surface of said semiconductor substrate covering part of the field-forming section and having at least one opening at a position entirely within the field-forming area, spaced from the field oxide;

an electrically conducting layer disposed on said insulating film and having an opening corresponding to the opening in said insulating film;

a first electrode layer electrically connected to said conducting layer; and a second electrode layer extending through the opening in said conducting layer and the opening in said insulating film and electrically connected to the surface of the semiconductor substrate, each of said Vpp switch circuits selectively supplying a write voltage Vpp generated by the charge pump circuit to respective memory cells of the memory cell array.

10. The EEPROM according to claim 9 wherein said charge pump circuit has a plurality of first transistors, each first transistor being connected in series to a corresponding first MOS capacitor, each of said Vpp switch circuits has a selection signal line for selecting between high and low level "supply write voltage Vpp and "not supply write voltage Vpp" signals, and a plurality of second transistors connected to said second MOS capacitors and said selection signal lines, turned on and off in accordance with the signal level on the respective selection signal line, each of said second MOS capacitors having a threshold voltage greater than threshold voltages of said first MOS capacitors, of said first transistors, and of said second transistors.

11. A microcomputer comprising:

a CPU for data processing; and an EEPROM including:

a semiconductor substrate including a surface and a field oxide disposed on part of the surface;

a charge pump circuit for generating a voltage Vpp for writing data into an EEPROM and having a plurality o first MOS capacitors, each first MOS capacitor having:

a field-forming area on the surface of said semiconductor substrate defined at a periphery by the field oxide;

an electrically insulating film disposed on the surface of said semiconductor substrate covering part of the field-forming section and having at least one opening at a position entirely within the field-forming area, spaced from the field oxide;

an electrically conducting layer disposed on said insulating film and having an opening corresponding to the opening in said insulating film;

a first electrode layer electrically connected to said conducting layer; and a second electrode layer extending through the opening in said conducting layer and the opening in said insulating film and electrically connected to the surface of the semiconductor substrate;

a memory array having a plurality of memory cells; and a plurality of Vpp switch circuits having second MOS capacitors, each second MOS capacitor having:

a field-forming area on the surface of said semiconductor substrate defined at a periphery by the field oxide;

an electrically insulating film disposed on the surface of said semiconductor substrate covering part of the field-forming section and having at least one opening at a position entirely within the field-forming area, space from the field oxide;

an electrically conducting layer disposed on said insulating film and having an opening corresponding to the opening in said insulating film;

a first electrode layer electrically connected to said conducting layer; and a second electrode layer extending through the opening in said conducting layer and the opening in said insulating film and electrically connected to the surface of the semiconductor substrate, each of said Vpp switch circuits selectively supplying a write voltage Vpp generated by the charge pump circuit to respective memory cells of the memory cell array.

* * * * *

UNITED STATES PATENT AND TRADEMARK OFFICE
CERTIFICATE OF CORRECTION

PATENT NO. : 5,530,274
DATED : June 25, 1996
INVENTOR(S) : Fujioka

It is certified that error appears in the above-indentified patent and that said Letters Patent is hereby corrected as shown below:

Column 7, Line 24, change ":" to --;--;

Column 9, Line 43, after "Vpp" insert --"--;

Column 10, Line 6, change "0" to --of--;

Line 36, change "space" to --spaced--.

Signed and Sealed this

Twenty-second Day of October, 1996

Attest:

BRUCE LEHMAN

*Attesting Officer*     Commissioner of Patents and Trademarks